US012757701B2

(12) United States Patent
Yu et al.

(10) Patent No.: US 12,757,701 B2
(45) Date of Patent: Oct. 6, 2026

(54) CATALYST-ENHANCED CHEMICAL VAPOR DEPOSITION

(71) Applicant: Tokyo Electron Limited, Tokyo (JP)

(72) Inventors: Kai-Hung Yu, Albany, NY (US); Hiroaki Niimi, Albany, NY (US); Robert D. Clark, Fremont, CA (US); Tadahiro Ishizaka, Nirasaki City (JP)

(73) Assignee: Tokyo Electron Limited, Tokyo (JP)

( * ) Notice: Subject to any disclaimer, the term of this patent is extended or adjusted under 35 U.S.C. 154(b) by 837 days.

(21) Appl. No.: 18/145,582

(22) Filed: Dec. 22, 2022

(65) Prior Publication Data

US 2024/0213093 A1 Jun. 27, 2024

(51) Int. Cl.
*H10W 20/00* (2026.01)

(52) U.S. Cl.
CPC .................................. *H10W 20/057* (2026.01)

(58) Field of Classification Search
CPC ......... H01L 21/76879; H01L 21/76814; H01L 21/28562; H10W 20/057; H10W 20/081; H10P 14/432
See application file for complete search history.

(56) References Cited

U.S. PATENT DOCUMENTS 11,024,535 B2 6/2021 Yu et al.
11,094,543 B1 8/2021 Han et al.
11,282,745 B2 3/2022 Yu et al.
2010/0248473 A1 9/2010 Ishizaka et al.
2019/0295891 A1 9/2019 Clark et al.
2020/0064737 A1* 2/2020 de Roest ................. G03F 7/405
2020/0118871 A1 4/2020 Yu et al.
2020/0343136 A1* 10/2020 Yu ..................... H01L 21/67184
2020/0347493 A1 11/2020 Liu et al.
2021/0317570 A1 10/2021 Yoon et al.
(Continued)

FOREIGN PATENT DOCUMENTS

WO 2019183035 A1 9/2019
WO 2021262527 A1 12/2021

OTHER PUBLICATIONS

Merkx et al., "Area-Selective Atomic Layer Deposition of TiN Using Aromatic Inhibitor Molecules for Metal/Dielectric Selectivity," American Chemical Society, Chemistry of Materials, vol. 32, No. 18, Aug. 13, 2020, p. 7788-7795, 8 pages total.
(Continued)

*Primary Examiner* — Julia Slutsker
(74) *Attorney, Agent, or Firm* — Slater Matsil, LLP

(57) ABSTRACT

A method for processing a substrate that includes: treating the substrate with a halogen-containing catalyst, the substrate including a semiconductor layer, a dielectric layer disposed over the semiconductor layer, a recess formed in the dielectric layer, and a layer of a first metal disposed between the dielectric layer and the semiconductor layer, the layer of the first metal being at a bottom of the recess, the halogen-containing catalyst modifying a surface of the layer of the first metal; after treating the substrate with the halogen-containing catalyst, treating the substrate with a molecular inhibitor (MI), the MI covering sidewalls of the dielectric layer in the recess; depositing a second metal over the modified surface of the layer of the first metal in the recess, where the MI covering the sidewalls prevents deposition of the second metal on the dielectric layer.

20 Claims, 6 Drawing Sheets

(56) References Cited

U.S. PATENT DOCUMENTS

| | | | |
|---|---|---|---|
| 2022/0208542 | A1* | 6/2022 | Maes .................... H01L 21/324 |
| 2022/0333232 | A1* | 10/2022 | Yoon ................. C23C 16/45551 |
| 2023/0245924 | A1 | 8/2023 | Narkeviciute et al. |
| 2024/0213093 | A1 | 6/2024 | Yu et al. |

OTHER PUBLICATIONS

International Searching Authority, "Notification of Transmittal of the International Search Report and the Written Opinion of the International Searching Authority, or the Declaration," International application No. PCT/US2023/063327, Date of mailing Jun. 28, 2023, 12 pages.

Gordon et al., "Trends in Copper Precursor Development for CVD and ALD Applications," ECS Journal of Solid State Science and Technology, vol. 4, No. 1, pp. N3188-N3197, Dec. 9, 2014, 11 pages.

Yang et al., "The role of iodide promoters and the mechanism of ethylene carbonylation catalyzed by molybdenum hexacarbonyl," Journal of Catalysis 319, pp. 211-219, Sep. 9, 2014, 9 pages.

International Search Report and Written Opinion, PCT/US2023/078497, mailed Feb. 28, 2024, Total pp. 13.

* cited by examiner

CATALYST-ENHANCED CHEMICAL VAPOR DEPOSITION

TECHNICAL FIELD

The present invention relates generally to methods of processing a substrate, and, in particular embodiments, to catalyst-enhanced chemical vapor deposition.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Scaling efforts to increase the number of interconnect elements per unit area are running into greater challenges as scaling enters nanometer-scale semiconductor device fabrication nodes. Therefore, there is a desire for three-dimensional (3D) semiconductor devices in which transistors are stacked on top of each other.

As device structures densify and develop vertically, the desire for precision material processing, for example, during deposition and patterning, becomes more compelling. Thus, further innovations are desired in various deposition techniques such as chemical vapor deposition (CVD), physical vapor deposition (PVD), and atomic layer deposition (ALD), to provide sufficient deposition rate, profile control, film conformality, and film quality among others.

SUMMARY

In accordance with an embodiment of the present invention, a method for processing a substrate that includes: treating the substrate with a halogen-containing catalyst, the substrate including a semiconductor layer, a dielectric layer disposed over the semiconductor layer, a recess formed in the dielectric layer, and a layer of a first metal disposed between the dielectric layer and the semiconductor layer, the layer of the first metal being at a bottom of the recess, the halogen-containing catalyst modifying a surface of the layer of the first metal; after treating the substrate with the halogen-containing catalyst, treating the substrate with a molecular inhibitor (MI), the MI covering sidewalls of the dielectric layer in the recess; depositing a second metal over the modified surface of the layer of the first metal in the recess, where the MI covering the sidewalls prevents deposition of the second metal on the dielectric layer.

In accordance with an embodiment of the present invention, a method for processing a substrate that includes: performing a cyclic chemical vapor deposition (CVD) process to fill a portion of a recess, the substrate including a dielectric layer having the recess and a first metal layer at a bottom of the recess, one cycle of the cyclic CVD process including treating the substrate with a halogen-containing catalyst, the halogen-containing catalyst modifying a surface of a second metal formed over the first metal layer, after treating the substrate with the halogen-containing catalyst, treating the substrate with a molecular inhibitor (MI), the MI covering sidewalls of the dielectric layer in the recess, and depositing the second metal over the first metal layer in the recess, where the MI covering the sidewalls prevents deposition of the second metal on the dielectric layer.

In accordance with an embodiment of the present invention, a method for processing a substrate that includes: exposing the substrate to a first vapor including a halogen-containing catalyst, the substrate including a dielectric surface and a first metal surface, the halogen-containing catalyst modifying a surface of the first metal surface; exposing the substrate to a second vapor including a molecular inhibitor (MI), the MI selectively adsorbing on the dielectric surface; and selectively depositing a second metal over the modified surface of the first metal surface by chemical vapor deposition (CVD), where a rate of deposition over the modified surface of the first metal surface is at least 100 times as high as a rate of deposition over the MI on the dielectric surface.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1H illustrate cross sectional views of a substrate at various stages of a chemical vapor deposition (CVD) process in accordance with various embodiments, wherein FIG. 1A illustrates an incoming substrate comprising a first metal layer and a dielectric layer with a recess feature, FIG. 1B illustrates the substrate after a pretreatment to expose the first metal layer, FIG. 1C illustrates the substrate after a treatment with a catalyst, FIG. 1D illustrates the substrate after a selective treatment with a molecular inhibitor (MI), FIG. 1E illustrates the substrate after depositing a second metal, FIG. 1F illustrates the substrate after a metal nuclei removal etch, FIG. 1G illustrates the substrate after a second treatment with the catalyst followed by a second treatment with the MI, and FIG. 1H illustrates the substrate after cycles of the CVD process to fill the recess with the second metal;

FIGS. 2A-2C schematically illustrate step-wise area-selective surface modification of the catalyst-enhanced CVD process in accordance with one embodiment, wherein FIG. 2A illustrates selective adsorption of the catalyst onto a metal, FIG. 2B illustrates selective adsorption of the molecular inhibitor (MI) onto silicon oxide, FIG. 2C illustrates selective metal deposition onto the metal; and FIGS. 3A-3C illustrate process flow diagrams of the methods of chemical vapor deposition (CVD) process in accordance with various embodiments, wherein FIG. 3A illustrates an embodiment, FIG. 3B illustrates another embodiment, and FIG. 3C illustrates yet another embodiment.

DETAILED DESCRIPTION OF ILLUSTRATIVE EMBODIMENTS

Figure 1A:
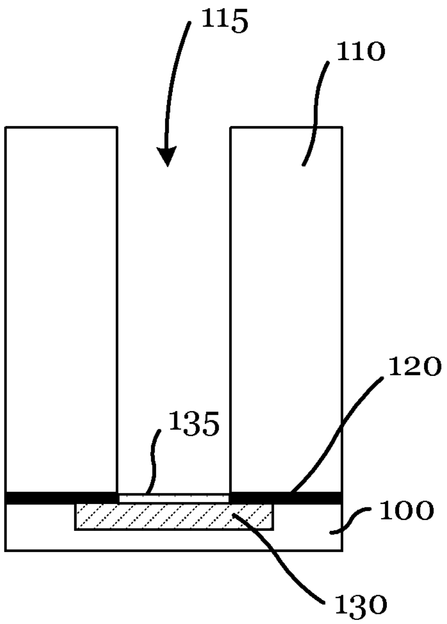

This application relates to methods of processing a substrate, more particularly to catalyst-enhanced chemical vapor deposition (CVD) for conductive materials. Generally, conductive materials are used in semiconductor devices to enable electrical connections between various components. Although copper (Cu) has been used for interconnects in integrated circuits (ICs) for decades, new conductive materials with lower electrical resistivity (e.g., Ru, Co, and W) have been tested as superior candidates for applications such as sub-10 nm node middle of line (MOL) and back end of line (BEOL) logic interconnects. Further, some of these new conductive materials, unlike Cu, may not require a diffusion barrier layer, which advantageously simplifies the fabrication process. However, depositing and patterning these metal materials with sufficient selectivity in high-aspect ratio (HAR) features at small scale has been difficult. In order to fill a high HAR recess with a metal without any void or pinch-off issues, bottom-up, selective metal deposition is desired. One solution is to use a molecular inhibitor during a deposition process, which may preferentially deposit metal on a metal surface compared to the inhibitor-covered surface of, for example, a dielectric. However, the inhibitor may also adsorb on the metal surface to cause impurity issues and decrease the metal deposition rate. Therefore, a new method for metal deposition with an improved deposition rate may be desired.

Embodiments of the present application disclose methods of catalyst-enhanced chemical vapor deposition (CVD) using a halogen-containing catalyst and a molecular inhibitor. In various embodiments, the methods of catalyst-enhanced CVD may be applied to selectively deposit a second conductive material over a first conductive material to fabricate interconnects in ICs. For example, a selective bottom-up fill of a recess may be enabled, where the deposition preferentially occurs over the surface of the first conductive material while undesired deposition over a dielectric material may be suppressed. In various embodiments, the methods of catalyst-enhanced CVD may comprise three steps: (1) treating the first conductive material surface with the halogen-containing catalyst (e.g., $I_2$, $CH_3I$, or $C_2H_5I$); (2) treating the dielectric surface with a molecular inhibitor (MI); and (3) selectively depositing the second conductive material over the first conductive material surface. The catalyst protects the first conductive material surface from undesired deposition of the MI and also catalyze the surface reactions that promotes the CVD of the second conductive material. Consequently, the methods of this disclosure may advantageously improve the overall deposition rate. In various embodiments, the methods of catalyst-enhanced CVD may be applied as a cyclic process to fill a high-aspect ratio (HAR) recess.

The methods described in this disclosure may particularly be advantageous for fabrication processes for sub-15 nm node middle of line (MOL) and back end of line (BEOL) logic interconnects, and may also enable using new metal materials such as Ru, Mo, Nb, and W for these applications. Although various embodiments of the methods are primarily described as CVD of a metal in this disclosure, the methods may also be applied in other methods such as atomic layer deposition (ALD), vapor deposition of more than one metals or other conductive materials (e.g., metal nitride).

In the following, the steps of the catalyst-enhanced CVD are described referring to FIGS. 1A-1H and 2A-2C in accordance with various embodiments. Example process flow diagrams are illustrated in FIG. 3A-3C. All figures in this disclosure are drawn for illustration purpose only and not to scale, including the aspect ratios of features.

FIGS. 1A-1H illustrate cross sectional views of a substrate 100 at various stages of a catalyst-enhanced CVD in accordance with various embodiments. The selective surface modification of the catalyst-enhanced CVD process is further schematically illustrated in FIGS. 2A-2C, which will be described along with FIGS. 1C-1E, respectively.

FIG. 1A illustrates a cross-sectional view of an incoming substrate 100. In various embodiments, the substrate 100 may be a part of, or includes, a semiconductor device, and may have undergone a number of steps of processing following, for example, a conventional process. The substrate 100 accordingly may comprise layers of semiconductors useful in various microelectronics. For example, the semiconductor structure may comprise the substrate 100 in which various device regions are formed.

In one or more embodiments, the substrate 100 may be a silicon wafer, or a silicon-on-insulator (SOI) wafer. In certain embodiments, the substrate 100 may comprise a silicon germanium wafer, silicon carbide wafer, gallium arsenide wafer, gallium nitride wafer and other compound semiconductors. In other embodiments, the substrate 100 comprises heterogeneous layers such as silicon germanium on silicon, gallium nitride on silicon, silicon carbon on silicon, as well layers of silicon on a silicon or SOI substrate. In various embodiments, the substrate 100 is patterned or embedded in other components of the semiconductor device.

As further illustrated in FIG. 1A, the substrate 100 may comprise a recess 115 formed in a dielectric layer 110. In certain embodiments, the substrate 100 may further comprise an etch stop layer 120 as a bottom layer of the dielectric layer 110, and a first metal layer 130 at the bottom of the recess 115. As illustrated in FIG. 1A, in one or more embodiments, a surface oxide layer 135 may be present on the surface of the first metal layer 130.

In various embodiments, the dielectric layer 110 may comprise silicon oxide, a low dielectric constant (low-k) material such as fluorinated silicon glass (FSG), carbon doped oxide, a polymer, a SiCOH-containing low-k material, a non-porous low-k material, a porous low-k material, a CVD low-k material, a spin-on dielectric (SOD) low-k material, or any other suitable dielectric material, including a high dielectric constant (high-k) material. In certain embodiments, a critical dimension (CD) of the recess 115 may be between about 10 nm and about 65 nm for via dominant structure, or between about 10 nm and about 100 nm for trench dominant structure in another embodiment. In one or more embodiments, the depth of the recess 115 may be between bout 40 nm and about 80 nm for single damascene structure, or between about 80 nm and about 150 nm for dual damascene structure. In various embodiments, the recess 115 may have an aspect ratio between about 4 and about 8 for single damascene, or between about 6 and about 10 for dual damascene.

The first metal layer 130 may comprise a low-resistivity metal such as copper (Cu), ruthenium (Ru), cobalt (Co), molybdenum (Mo) or tungsten (W). Although not illustrated in FIG. 1A, in certain embodiments, the first metal layer 130 may comprise two or more stacked conductive layers. Examples of the stacked conductive layers include Co metal on Cu metal (Co/Cu) and Ru metal on Cu metal (Ru/Cu).

The ESL 120 may comprise a dielectric such as silicon nitride, silicon oxynitride, silicon carbide, or silicon carbonitride. The ESL 120 may be deposited using deposition techniques such as vapor deposition including chemical vapor deposition (CVD), physical vapor deposition (PVD), and atomic layer deposition (ALD), as well as other plasma processes such as plasma enhanced CVD (PECVD), sputtering, and other processes. In certain embodiments, the thickness of the ESL 120 may be between 2 nm to 5 nm.

Figure 1B:
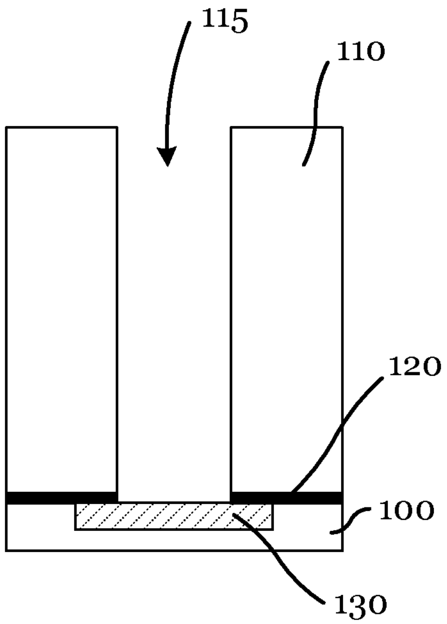

FIG. 1B illustrates a cross sectional view of the substrate 100 after a pretreatment to expose the first metal layer 130.

In various embodiments, prior to any treatment with a catalyst or molecular inhibitor for CVD, the pretreatment may be performed to remove the surface oxide layer 135 and to expose the first metal layer 130. The pretreatment may comprise treating the surface oxide layer 135, for example, with a plasma comprising dihydrogen ($H_2$). In other embodiments, the pretreatment may be skipped if the substrate 100 is already free from any surface oxide.

Figure 1C:
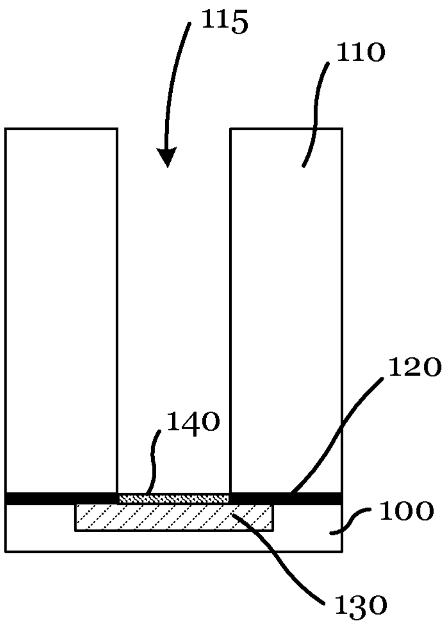

FIG. 1C illustrates a cross sectional view of the substrate after a treatment with a catalyst.

Figure 2A:
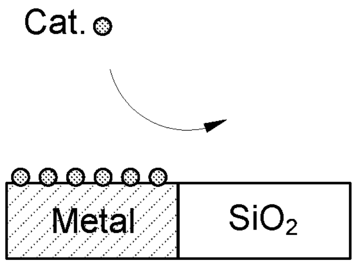
Figure 3A:
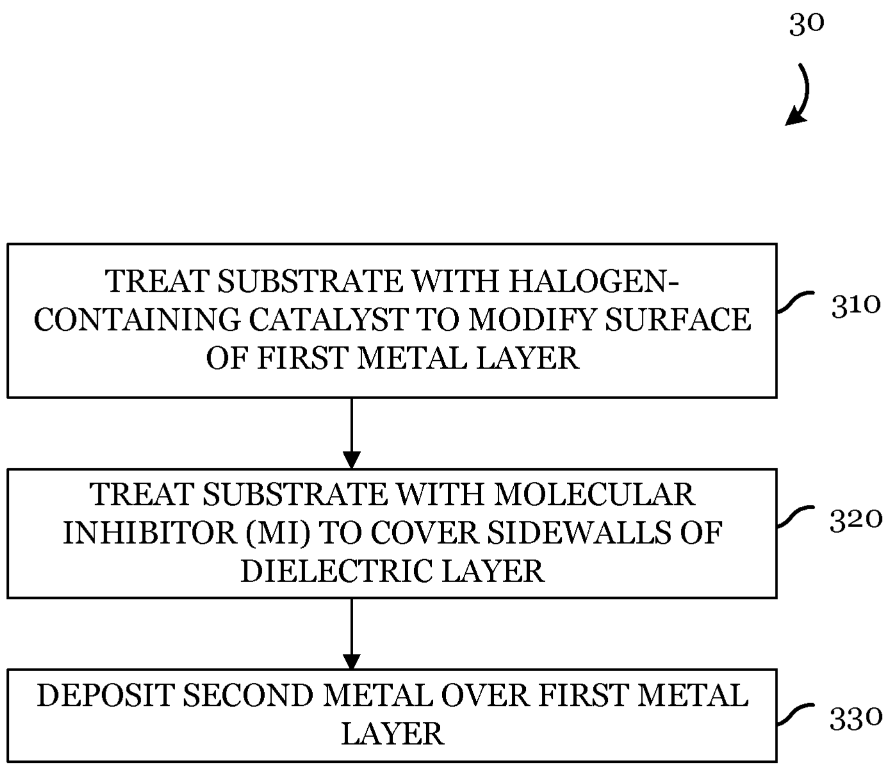
Figure 3B:
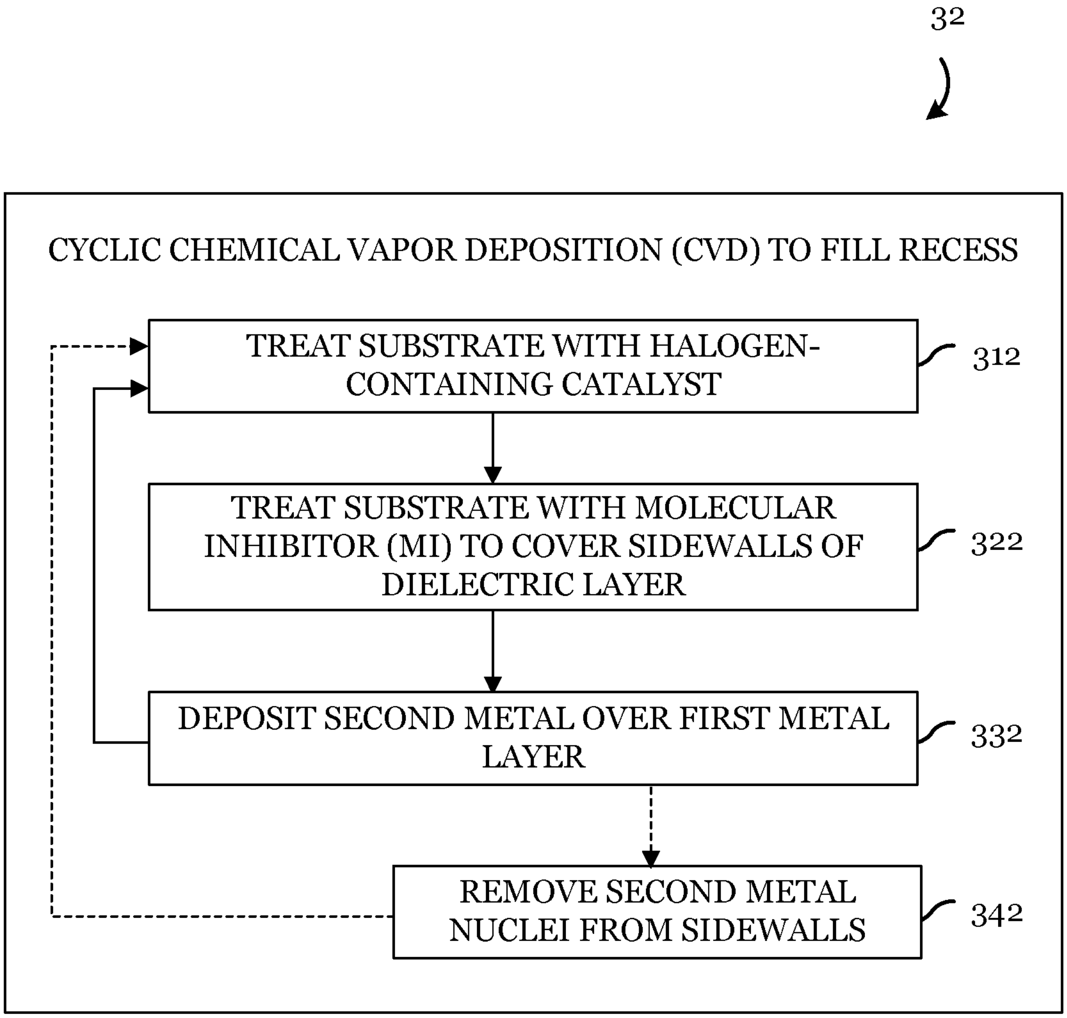
Figure 3C:
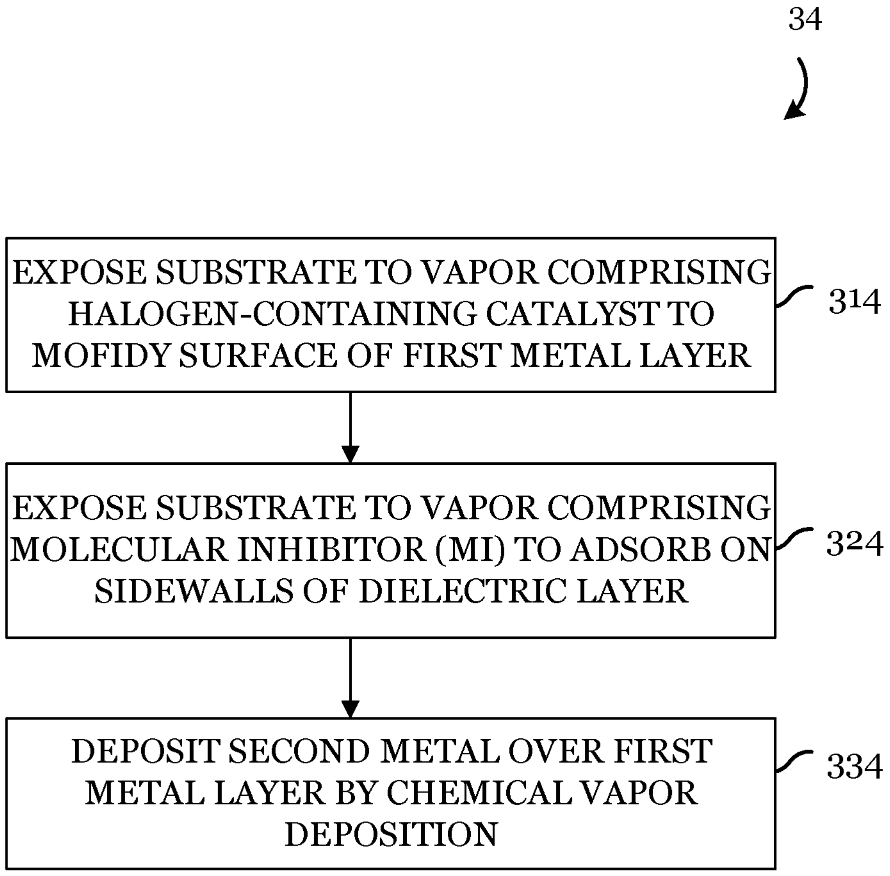

FIG. 2A illustrates selective adsorption of the catalyst onto a metal in accordance with one embodiment.

In FIG. 1C, the substrate 100 may be treated with a catalyst to selectively cover the exposed surface of the first metal layer 130, resulting in a modified first metal surface 140. In one embodiment, as illustrated in FIG. 2A, the catalyst may only adsorb on a metal selectively to a dielectric surface such as silicon oxide. With the catalyst covering the first metal layer 130, a subsequent step with a molecular inhibitor may advantageously adsorb selectively on the dielectric layer 110. In various embodiments, the catalyst may be delivered to the substrate 100 as a vapor diluted in a noble or inert carrier gas (e.g., Ar or $N_2$), where the substrate temperature about room temperature in fab ambient (air) may be maintained. In one embodiment, this exposure with the catalyst may be performed for 1-120 s with heated stage or temperature-elevated techniques.

In various embodiments, the catalyst may comprise a halogen, and in certain embodiments, the halogen-containing catalyst may comprise an iodine (I) or bromine (Br) compound, for example, an alkyl halide. In one or more embodiments, the halogen-containing catalyst may comprise $I_2$, $CH_3I$, $C_2H_5I$, $Br_2$, $CH_3Br$, or $C_2H_5Br$. In one embodiment, the halogen-containing catalyst may adsorb onto the first metal layer 130 to form the modified first metal surface 140 as a halogen-containing monolayer. In other embodiments, the coverage of the surface of the first metal layer 130 may be only partial, or more than a monolayer may be formed as the modified first metal surface 140.

Although this disclosure primarily describes the methods with a halogen-containing catalyst, any suitable molecules that may interact with a metal precursor during the CVD and promotes the surface reaction for metal deposition may be used. In one or more embodiments, the catalyst may be oxygen-free to prevent any chance of oxygen interacting with the metal and cause impurity issues.

Figure 1D:
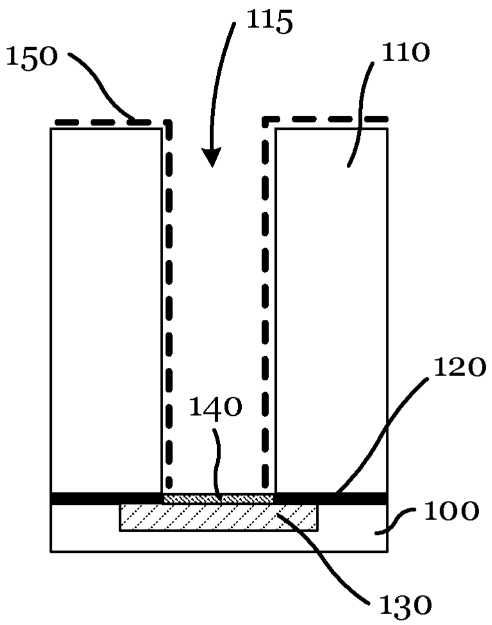

FIG. 1D illustrates the substrate 100 after a selective treatment with a molecular inhibitor (MI).

Figure 2B:
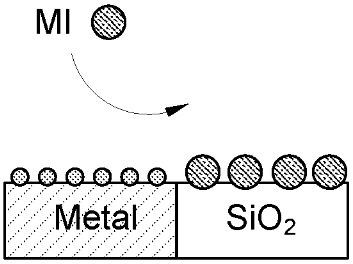

FIG. 2B illustrates selective adsorption of the MI onto a silicon oxide surface.

In FIG. 1D, the substrate 100 may be treated with a molecular inhibitor (MI). The MI may selectively cover the exposed surface of the dielectric layer 110, both sidewalls and a top horizontal surface, resulting in a passivated dielectric surface 150. The presence of the catalyst as the modified first metal surface 140 can prevent the undesired MI adsorption on the first metal layer 130. This is further illustrated in FIG. 2B, where the MI adsorbs only on the silicon oxide surface. In various embodiments, the MI may be vaporized and delivered to the substrate 100 as a vapor diluted in an inert/noble carrier gas (e.g., Ar or $N_2$). In certain embodiments, the treatment may be performed with a substrate temperature between about 80° C. and about 250° C., and a process chamber pressure of about 1-10 Torr, and a 1-120 s exposure time with no plasma excitation.

Although not wishing to be limited by any theory, the treatment with the MI may make the surface of the dielectric layer 110 more hydrophobic, which may be beneficial in reducing deposition of a metal precursor during a metal deposition step (the inhibiting effect). Accordingly, the MI may be selected from molecules with hydrophobic groups (e.g., alkyl or aryl). Further, such molecules are generally capable of forming stable chemical bonds with the surface of the dielectric layer 110 (e.g., Si—O—Si), and thus may comprise a silane compound. In various embodiments, the MI comprises an alkyl silane, an alkoxysilane, an alkyl alkoxysilane, an alkyl siloxane, an alkoxysiloxane, an alkyl alkoxysiloxane, an aryl silane, an acyl silane, an aryl siloxane, an acyl siloxane, a silazane, dimethylsilane dimethylamine (DMSDMA), trimethylsilane dimethylamine (TMSDMA), bis(dimethylamino) dimethylsilane (BDMADMS), N,O bistrimethylsilyltrifluoroacetamide (BSTFA), or trimethylsilyl-pyrrole (TMS-pyrrole).

Figure 1E:
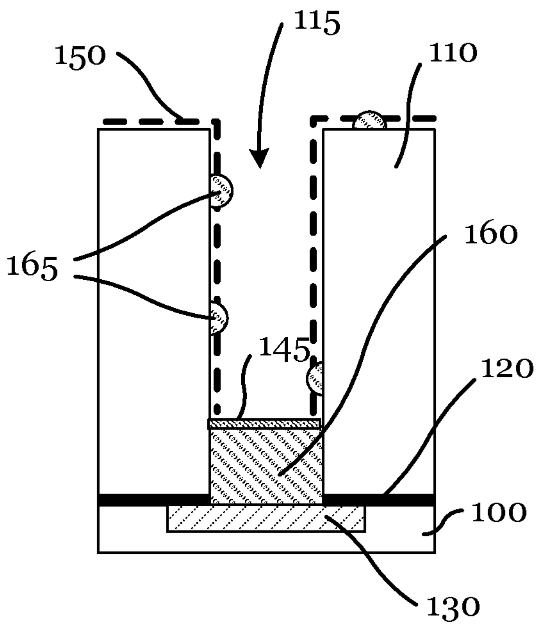

FIG. 1E illustrates a cross sectional view of the substrate 100 after depositing a second metal 160.

Figure 2C:
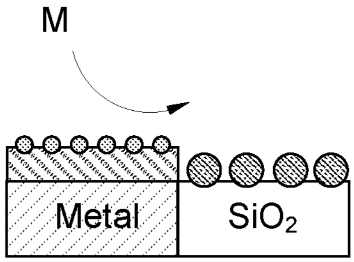

FIG. 2C illustrates selective metal deposition onto the metal.

In various embodiments, the metal deposition step may performed using chemical vapor deposition (CVD), but in other embodiment, other techniques such as atomic layer deposition (ALD) may be used. The second metal 160 may comprise a low-resistivity metal such as Cu, Ru, Co, or W. The second metal 160 may or may not be the same material used for the first metal layer 130. Although not illustrated in FIG. 1F, in certain embodiments, more than one metal may be deposited to form an alloy or stacked conductive layers. Because the sidewalls and top surface of the dielectric layer 110 is still passivated with the MI, the second metal 160 may be selectively deposited over the first metal layer 130 and may grow bottom-up from first metal layer 130.

In certain embodiments, Ru metal may be deposited by chemical vapor phase deposition (CVD) or atomic layer deposition (ALD) using Ru-containing precursors. Examples of Ru-containing precursors include $Ru_3(CO)_{12}$, (2,4-dimethylpentadienyl) (ethylcyclopentadienyl) ruthenium (Ru(DMPD)(EtCp)), bis(2,4-dimethylpentadienyl) ruthenium ($Ru(DMPD)_2$), 4-dimethylpentadienyl) (methylcyclopentadienyl) ruthenium (Ru(DMPD)(MeCp)), and bis (ethylcyclopentadienyl) ruthenium ($Ru(EtCp)_2$), as well as combinations of these and other precursors. In one embodiment, the process condition for a Ru metal CVD process may include a process gas containing $Ru_3(CO)_{12}$and CO (e.g., a gas flow ratio of about 1:1000), a substrate temperature between about 100° C. and about 250° C., a process chamber pressure between about 1 mTorr and about 500 mTorr, and a 400 s exposure without plasma excitation that deposits between about 10 nm and 20 nm of Ru metal on the metal surface.

Based on this catalyst-enhanced CVD method, both the rate of metal deposition and the selectivity may be improved taking advantage of the MI and the catalyst. First, the MI on the dielectric layer 110 suppresses the undesired metal deposition on the dielectric layer 110, which therefore improves the selectivity. In addition, the presence of the catalyst in the modified first metal surface 140 promotes the surface reaction and thereby the metal deposition, for example, forming an intermediate metal complex. Since the catalyst is present only on the first metal layer 130 and not on the dielectric layer 110, both the deposition rate and selectivity may be improved.

In certain embodiments, as illustrated in FIG. 1E, the catalyst may remain on surface as a modified second metal surface 145 after the metal deposition step. In other embodiments, although not illustrated, a portion or entirety of the catalyst may migrate into the metal (e.g., the first metal layer 130 or the second metal 160) or consumed and removed from the substrate 100 as a gaseous by-product. In one embodiment, any excess or residual catalyst may be desorbed from the surface by an additional thermal treatment. Accordingly, in one or more embodiments, the catalyst may be replenished by a subsequent step (e.g., FIG. 1G) before continuing the metal deposition.

In various embodiments, as further illustrated in FIG. 1E, the metal deposition step may fill a portion of the recess 115, for example, about a fourth of the initial depth of the recess 115. In one embodiment, a target thickness of the second metal 160 deposited per metal deposition step may be between about 10 nm and 20 nm.

In other embodiments, the recess 115 may be completely filled with one metal deposition step. In certain embodiments, the metal deposition step may be terminated at a certain height to avoid excessive formation of metal nuclei 165 over the dielectric layer 110. These metal nuclei 165 may be formed due to adsorption of the metal precursor on the MI or imperfect passivation of the dielectric layer 110 by the MI. The metal nuclei 165 over the dielectric layer 110, especially over the sidewalls, may lead to lateral growth of the second metal 160, potentially causing pinch-off issues. Accordingly, in various embodiments, the catalyst-enhanced CVD may be performed as a cyclic process including a metal nuclei removal etch as described below (FIG. 1F), and the recess 115 may be filled with the cycles of the catalyst-enhanced CVD process.

Figure 1F:
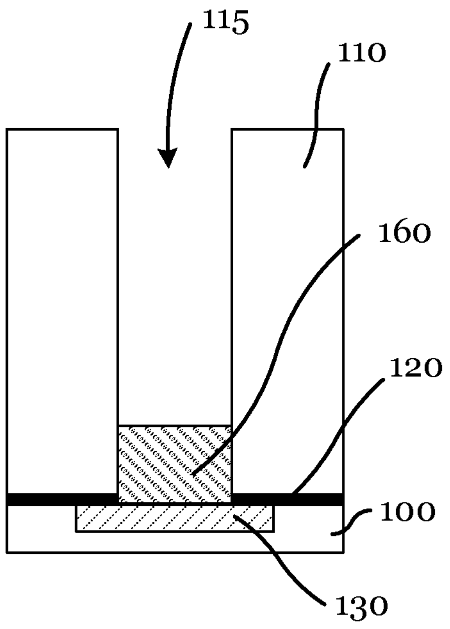

FIG. 1F illustrates a cross sectional view of the substrate 100 after a metal nuclei removal etch.

To minimize the undesired lateral metal growth, following the metal deposition step, the metal nuclei removal etch may be performed to clean the sidewalls and top surface of the dielectric layer 110. It may be preferable to remove the metal nuclei 165 before they become too large and more difficult to remove efficiently. As illustrated in FIG. 1F, after the metal nuclei removal etch, the MI and the catalyst may also be removed from the dielectric layer 110 and the second metal 160. In certain embodiments, the metal nuclei removal etch may be performed using reactive ion etching (RIE), for example using plasma-excited $O_2$gas and optionally adding a halogen-containing gas (e.g., $Cl_2$). In one embodiment, the process conditions for the $O_2$-$Cl_2$ RIE for the metal nuclei removal etch may include an etching comprising $O_2$and $Cl_2$(e.g., a gas flow ratio of about 100:1), a substrate temperature between about room temperature and about 370° C., plasma excitation using a capacitively coupled plasma (CCP) source with about 1200 W of RF power applied to a top electrode and between about 0 W and about 300 W of RF power applied to a bottom electrode, a process chamber pressure of about 5 mTorr, and a 40 s exposure time to remove the equivalent of about 5 nm of metal nuclei. In certain embodiments, the metal nuclei removal etch may be performed using chemical vapor etching (CVE). In another embodiment, a treatment with ozone ($O_3$) gas may also be used for the metal nuclei removal etch. The ozone for the ozone treatment may be generated from dioxygen ($O_2$) gas with UV excitation with an example process conditions as follows: process temperature between about 50° C. and 200° C.; pressure range between about 500 mT to 10 Torr diluted with Ar gas; ozone exposure duration between 1 s to 60 s; and ozone density between 100 $g/m^3$ and 300 $g/m^3$. The ozone treatment can be applied onto BEOL metallization without causing damage on low-k dielectric and may be advantageous over a $O_2$-plasma-based RIE.

In other embodiments, although not illustrated, the metal deposition (FIG. 1E) may be achieved without any metal nuclei (e.g., the metal nuclei 165 in FIG. 1E) over the sidewall of the dielectric layer 110, and in these cases, the metal nuclei removal etch may be skipped. In certain embodiments, the MI may not completely stop metal deposition over the dielectric layer 110, while it may substantially slow the deposition rate. In one example, the deposition rate over the first metal layer 130 may be at least 100 times as high as the deposition rate over the dielectric layer 110. In one embodiment, the MI may inhibit metal deposition by extending the incubation time of chemical vapor deposition (CVD) of the metal on dielectric layer 110 by 10-50 times.

Figure 1G:
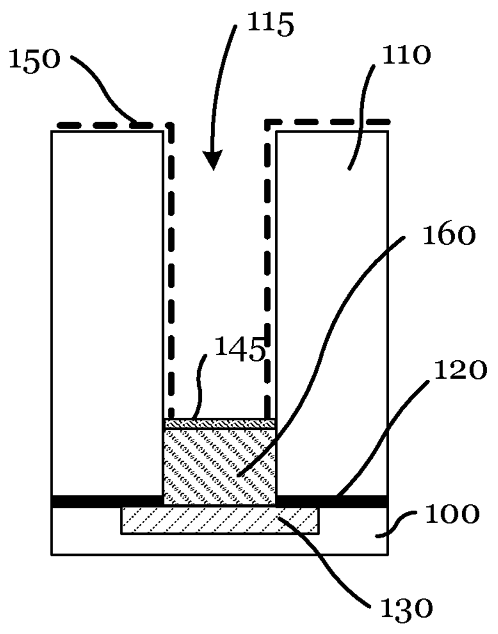

FIG. 1G illustrates a cross sectional view of the substrate 100 after a second treatment with the catalyst followed by a second treatment with the MI.

In various embodiments, the methods of catalyst-enhanced CVD may be performed as a cyclic process by repeating the steps of catalyst treatment (e.g., FIGS. 1C and 2A), selective MI treatment (e.g., FIGS. 1D and 2B), and metal deposition (e.g., FIGS. 1E and 2C), and metal nuclei removal etch (e.g., FIG. 1F). As illustrated in FIG. 1G, after the metal nuclei removal etch (FIG. 1F), the dielectric layer 110 may be cleaned and free from any metal nuclei. Further, the MI and the catalyst that may have been present after the metal deposition step may also be removed. During the second catalyst treatment, the catalyst may interact with the surface of the second metal 160 that was deposited in the first cycle, forming the modified second metal surface 145. During the second MI treatment, the MI may cover the exposed surface of the dielectric layer 110, both sidewalls and a top horizontal surface, restoring the passivated dielectric surface 150. With the replenished catalyst and MI, the substrate 100 may be subject to a subsequent metal deposition step to further fill the recess 115 with the second metal 160.

Figure 1H:
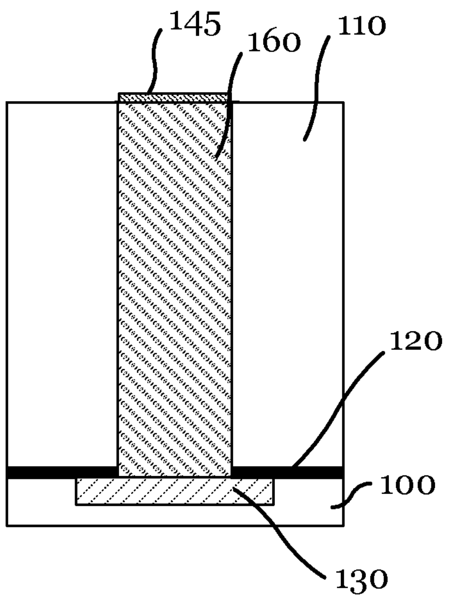

FIG. 1H illustrates a cross sectional view of the substrate 100 after cycles of the catalyst-enhanced CVD process to fill the recess 115 with the second metal 160.

Each cycle of the selective metal deposition process may fill a portion of the recess 115 with the second metal 160, and may be repeated until the recess 115 is completely filled. In one embodiment, the impurity level (e.g., Si) in the filled recess may be below a detection limit (e.g., ±0.1 atom %) of a common technique such as elemental analysis or X-ray photoelectron spectroscopy (XPS). Further, the filled recess may be void-free. In one embodiment, the recess 115 may be completely filled by two to four cycles of the selective metal deposition process, but in other embodiments, any number of cycles may be performed. In certain embodiments, process conditions for the steps of the selective metal deposition process may be adjusted for each cycle in view of the aspect ratio of the remaining recess. For example, the exposure time for the metal deposition for the first cycle may be shorter than those for the subsequent cycles because the metal nuclei formation over the sidewalls may be more likely to occur due to higher surface area. In various embodiments, each step of selective metal deposition process (e.g., FIGS. 1A-1H) may be performed within the thermal budget for the target semiconductor device fabrication, for example, below 400° C.

FIGS. 3A-3C illustrate process flow diagrams of the methods of catalyst-enhanced CVD process in accordance with various embodiments. The process flow can be followed with the figures (FIGS. 1C-1E) discussed above and hence will not be described again.

In FIG. 3A, a process flow 30 starts with treating a substrate with a halogen-containing catalyst, where the substrate comprises a recess formed in a dielectric layer and a first metal layer in the recess (block 310, FIG. 1C). The surface of the first metal layer may be selectively covered with the halogen-containing catalyst. The substrate may then be treated with a molecular inhibitor (MI) to cover sidewalls of the dielectric layer in the recess (block 320, FIG. 1D). Subsequently, a second metal may then be selectively deposited over the first metal layer in the recess, where the MI covering the sidewalls prevents deposition of the second metal on the dielectric layer (block 330, FIG. 1E).

In FIG. 3B, a cyclic chemical vapor deposition (CVD) process 32 starts with treating a substrate with a halogen-containing catalyst to cover a surface of a metal (e.g., a first metal layer in a first cycle of the cyclic CVD process and a surface of a second metal in subsequent cycles) (block 312, FIG. 1C). The substrate may comprise a dielectric layer having a recess and the first metal layer exposed at a bottom of the recess. After treating the substrate with the halogen-containing catalyst, the substrate may then be treated with a MI to cover sidewalls of the dielectric layer in the recess (block 322, FIG. 1D). Subsequently, a second metal may then be selectively deposited over the first metal layer in the recess, where the MI covering the sidewalls prevents deposition of the second metal on the dielectric layer (block 332, FIG. 1E). These steps (blocks 312, 322, and 332) may be cyclically repeated in certain embodiments. In other embodiments, where depositing the second metal deposits second metal nuclei on a portion of the sidewalls, an additional etch may be inserted in one or more of the cycles of the cyclic CVD process to remove the second metal nuclei from the portion of the sidewalls (block 342, FIG. 1F). In an embodiment, the cyclic CVD process partially fills the recess with the second metal, and the method further includes performing another deposition process to fill a remainder of the recess with the second metal or another metal. In an embodiment, the another deposition process can be a wet process, for example a metal plating process.

In FIG. 3C, another process flow 34 starts with exposing a substrate to a first vapor comprising a halogen-containing catalyst, where the substrate comprises a recess formed in a dielectric layer and a first metal layer in the recess (block 314, FIG. 1C). The halogen-containing catalyst adsorbs on the first metal layer selectively to sidewalls of the dielectric layer in the recess. The substrate may then be exposed to a second vapor comprising a MI (block 324, FIG. 1D), where the MI selectively adsorbs on the sidewalls and the adsorbed halogen-containing catalyst preventing the MI from adsorbing on the first metal layer. Subsequently, a second metal may then be selectively deposited over the first metal layer in the recess by CVD, where the rate of deposition over the first metal layer is at least twice as high as a rate of deposition over the MI (block 334, FIG. 1E).

The catalyst-enhanced chemical vapor deposition (CVD) using a catalyst and a molecular inhibitor in various embodiments may advantageously eliminate or minimize the impurity issues from inhibitor contamination. The methods are particularly useful for vapor metal deposition to fill a high-aspect ratio (HAR) recess for applications such as sub-10 nm node middle of line (MOL) and back end of line (BEOL) logic interconnects, where the impurity, even at a very low level, hampers the conductivity and thereby device performance. Although the disclosure primarily describes embodiments for chemical vapor deposition of a low-resistivity metal (e.g., Cu, Ru, Co, and W), the methods may also be applied to atomic layer deposition (ALD) or other deposition techniques. Further, in certain embodiments, the methods may be used to deposit metal compounds (e.g., metal oxide and metal nitride), where the step of selective metal deposition may be followed by an additional treatment to convert the deposited metal into the metal compounds.

Example embodiments of the invention are summarized here. Other embodiments can also be understood from the entirety of the specification as well as the claims filed herein.

Example 1. A method for processing a substrate that includes: treating the substrate with a halogen-containing catalyst, the substrate including a semiconductor layer, a dielectric layer disposed over the semiconductor layer, a recess formed in the dielectric layer, and a layer of a first metal disposed between the dielectric layer and the semiconductor layer, the layer of the first metal being at a bottom of the recess, the halogen-containing catalyst modifying a surface of the layer of the first metal; after treating the substrate with the halogen-containing catalyst, treating the substrate with a molecular inhibitor (MI), the MI covering sidewalls of the dielectric layer in the recess; depositing a second metal over the modified surface of the layer of the first metal in the recess, where the MI covering the sidewalls prevents deposition of the second metal on the dielectric layer.

Example 2. The method of example 1, where the substrate further includes a surface oxide layer over the layer of the first metal, further including, prior to treating the substrate with the halogen-containing catalyst, removing the surface oxide layer to expose the first metal layer in the recess.

Example 3. The method of one of examples 1 or 2, where depositing the second metal deposits second metal nuclei on a portion of the sidewalls, further including removing the second metal nuclei.

Example 4. The method of one of examples 1 to 3, where depositing the second metal is achieved bottom-up and without the second metal growing from the dielectric layer.

Example 5. The method of one of examples 1 to 4, where the halogen-containing catalyst includes an iodine-containing compound.

Example 6. The method of one of examples 1 to 5, where the halogen-containing catalyst includes $I_2$, $CH_3I$, or $C_2H_5I$.

Example 7. The method of one of examples 1 to 6, where the MI includes an alkyl silane, an alkoxysilane, an alkyl alkoxysilane, an alkyl siloxane, an alkoxysiloxane, an alkyl alkoxysiloxane, an aryl silane, an acyl silane, an aryl siloxane, an acyl siloxane, a silazane, dimethylsilane dimethylamine (DMSDMA), trimethylsilane dimethylamine (TMSDMA), bis(dimethylamino) dimethylsilane (BDMADMS), N,O bistrimethylsilyltrifluoroacetamide (BSTFA), or trimethylsilyl-pyrrole (TMS-pyrrole).

Example 8. The method of one of examples 1 to 7, where the first metal layer includes Ru, Co, or W, and where the second metal includes Cu, Ru, Co, or W.

Example 9. A method for processing a substrate that includes: performing a cyclic chemical vapor deposition (CVD) process to fill a portion of a recess, the substrate including a dielectric layer having the recess and a first metal layer at a bottom of the recess, one cycle of the cyclic CVD process including treating the substrate with a halogen-containing catalyst, the halogen-containing catalyst modifying a surface of a second metal formed over the first metal layer, after treating the substrate with the halogen-containing catalyst, treating the substrate with a molecular inhibitor (MI), the MI covering sidewalls of the dielectric layer in the recess, and depositing the second metal over the first metal layer in the recess, where the MI covering the sidewalls prevents deposition of the second metal on the dielectric layer.

Example 10. The method of example 9, where depositing the second metal deposits second metal nuclei on a portion of the sidewalls, and where one of the cyclic CVD process further includes removing the second metal nuclei from the portion of the sidewalls.

Example 11. The method of one of examples 9 or 10, where the cyclic CVD process completely fills the recess with the second metal.

Example 12. The method of one of examples 9 to 11, where the cyclic CVD process partially fills the recess with the second metal, further including performing another deposition process to fill a remainder of the recess with the second metal or another metal.

Example 13. The method of one of examples 9 to 12, where the another deposition process is a wet process.

Example 14. The method of one of examples 9 to 13, where the MI includes a silane, and the second metal that fills the recess is without any detectable silicon or silane impurity Example 15. The method of one of examples 9 to 14, where the first metal layer includes Ru, Co, or W, and where the second metal includes Cu, Ru, Co, or W.

Example 16. The method of one of examples 9 to 15, where the halogen-containing catalyst includes $I_2$, $CH_3I$, or $C_2H_5I$.

Example 17. A method for processing a substrate that includes: exposing the substrate to a first vapor including a halogen-containing catalyst, the substrate including a dielectric surface and a first metal surface, the halogen-containing catalyst modifying a surface of the first metal surface; exposing the substrate to a second vapor including a molecular inhibitor (MI), the MI selectively adsorbing on the dielectric surface; and selectively depositing a second metal over the modified surface of the first metal surface by chemical vapor deposition (CVD), where a rate of deposition over the modified surface of the first metal surface is at least 100 times as high as a rate of deposition over the MI on the dielectric surface.

Example 18. The method of example 17, where the first metal layer includes Ru, Co, or W, and where the second metal includes Cu, Ru, Co, or W.

Example 19. The method of one of examples 17 or 18, where the substrate includes a recess prior to depositing the second metal, the recess having a critical dimension (CD) between 10 nm and 65 nm.

Example 20. The method of one of examples 17 to 19, where the substrate includes a recess prior to depositing the second metal, the recess having an aspect ratio (height-to-width ratio) of at least 4:1.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for processing a substrate, the method comprising:

treating the substrate with a halogen-containing catalyst, the substrate comprising a semiconductor layer, a dielectric layer disposed over the semiconductor layer, a recess formed in the dielectric layer, and a layer of a first metal disposed between the dielectric layer and the semiconductor layer, the layer of the first metal being at a bottom of the recess, the halogen-containing catalyst selectively modifying a surface of the layer of the first metal;

after treating the substrate with the halogen-containing catalyst, treating the substrate with a molecular inhibitor (MI), the MI covering sidewalls of the dielectric layer in the recess; and depositing a second metal over the modified surface of the layer of the first metal in the recess, wherein the MI covering the sidewalls prevents deposition of the second metal on the dielectric layer.

2. The method of claim 1, wherein the substrate further comprises a surface oxide layer over the layer of the first metal, further comprising, prior to treating the substrate with the halogen-containing catalyst, removing the surface oxide layer to expose the layer of the first metal in the recess.

3. The method of claim 1, wherein depositing the second metal deposits second metal nuclei on a portion of the sidewalls, further comprising removing the second metal nuclei.

4. The method of claim 1, wherein depositing the second metal is achieved bottom-up and without the second metal growing from the dielectric layer.

5. The method of claim 1, wherein the halogen-containing catalyst comprises an iodine-containing compound.

6. The method of claim 5, wherein the halogen-containing catalyst comprises $I_2$, $CH_3I$, or $C_2H_5I$.

7. The method of claim 1, wherein the MI comprises an alkyl silane, an alkoxysilane, an alkyl alkoxysilane, an alkyl siloxane, an alkoxysiloxane, an alkyl alkoxysiloxane, an aryl silane, an acyl silane, an aryl siloxane, an acyl siloxane, a silazane, dimethylsilane dimethylamine (DMSDMA), trimethylsilane dimethylamine (TMSDMA), bis(dimethylamino) dimethylsilane (BDMADMS), N,O bistrimethylsilyltrifluoroacetamide (BSTFA), or trimethylsilyl-pyrrole (TMS-pyrrole).

8. The method of claim 1, wherein the first metal comprises Ru, Co, or W, and wherein the second metal comprises Cu, Ru, Co, or W.

9. A method for processing a substrate, the method comprising:

performing a cyclic chemical vapor deposition (CVD) process to fill a portion of a recess, the substrate comprising a dielectric layer having the recess and a first metal layer at a bottom of the recess, one cycle of the cyclic CVD process comprising;

treating the substrate with a halogen-containing catalyst, the halogen-containing catalyst selectively modifying a surface of a second metal formed over the first metal layer;

after treating the substrate with the halogen-containing catalyst, treating the substrate with a molecular inhibitor (MI), the MI covering sidewalls of the dielectric layer in the recess; and depositing the second metal over the first metal layer in the recess, wherein the MI covering the sidewalls prevents deposition of the second metal on the dielectric layer.

10. The method of claim 9, wherein depositing the second metal deposits second metal nuclei on a portion of the sidewalls, and wherein the one cycle of the cyclic CVD process further comprises removing the second metal nuclei from the portion of the sidewalls.

11. The method of claim 9, wherein the cyclic CVD process completely fills the recess with the second metal.

12. The method of claim 9, wherein the cyclic CVD process partially fills the recess with the second metal, further comprising performing another deposition process to fill a remainder of the recess with the second metal or another metal.

13. The method of claim 12, wherein the another deposition process is a wet process.

14. The method of claim 9, wherein the MI comprises a silane, and the second metal that fills the recess is without any detectable silicon or silane impurity.

15. The method of claim 9, wherein the first metal layer comprises Ru, Co, or W, and wherein the second metal comprises Cu, Ru, Co, or W.

16. The method of claim 9, wherein the halogen-containing catalyst comprises $I_2$, $CH_3I$, or $C_2H_5I$.

17. A method for processing a substrate, the method comprising:

exposing the substrate to a first vapor comprising a halogen-containing catalyst, the substrate comprising a dielectric surface and a first metal surface, the halogen-containing catalyst modifying a surface of the first metal surface;

exposing the substrate to a second vapor comprising a molecular inhibitor (MI), the MI selectively adsorbing on the dielectric surface; and selectively depositing a second metal over the modified surface of the first metal surface by chemical vapor deposition (CVD), wherein a rate of deposition over the modified surface of the first metal surface is at least 100 times as high as a rate of deposition over the MI on the dielectric surface.

18. The method of claim 17, wherein the first metal surface comprises Ru, Co, or W, and wherein the second metal comprises Cu, Ru, Co, or W.

19. The method of claim 17, wherein the substrate comprises a recess prior to depositing the second metal, the recess having a critical dimension (CD) between 10 nm and 65 nm.

20. The method of claim 17, wherein the substrate comprises a recess prior to depositing the second metal, the recess having an aspect ratio (height-to-width ratio) of at least 4:1.

* * * * *